US012803525B2

(12) United States Patent
Rath

(10) Patent No.: US 12,803,525 B2
(45) Date of Patent: Nov. 17, 2026

(54) SURFACE ACOUSTIC WAVE DEVICE HAVING AN INTERFACE LAYER BETWEEN AN IDT AND A PIEZOELECTRIC LAYER

(71) Applicant: Qorvo US, Inc., Greensboro, NC (US)

(72) Inventor: Patrik Rath, Munich (DE)

(73) Assignee: Qorvo US, Inc., Greensboro, NC (US)

( * ) Notice: Subject to any disclaimer, the term of this patent is extended or adjusted under 35 U.S.C. 154(b) by 131 days.

(21) Appl. No.: 18/383,286

(22) Filed: Oct. 24, 2023

(65) Prior Publication Data

US 2024/0275357 A1 Aug. 15, 2024

Related U.S. Application Data

(60) Provisional application No. 63/484,019, filed on Feb. 9, 2023.

(51) Int. Cl.

| | |
|---|---|
| ***H03H 9/145*** | (2006.01) |
| ***H03H 3/08*** | (2006.01) |
| ***H03H 9/02*** | (2006.01) |
| ***H03H 9/25*** | (2006.01) |

(52) U.S. Cl.

CPC .......... *H03H 9/14552* (2013.01); *H03H 3/08* (2013.01); *H03H 9/02574* (2013.01); *H03H 9/25* (2013.01)

(58) Field of Classification Search

CPC ........ H03H 9/02574; H03H 9/25; H03H 3/08; H03H 9/02559; H03H 9/02228; H03H 3/02; H03H 9/02834; H03H 9/145; H03H 9/175; H03H 9/02015; H03H 9/64; H03H 9/0222; H03H 9/02866; H03H 9/6483; H03H 9/14541; H03H 3/10; H03H 9/174; H03H 9/02992; H03H 9/568; H03H 9/02157; H03H 2003/027; H03H 9/02818;

(Continued)

(56) References Cited

U.S. PATENT DOCUMENTS

| | | | | |
|---|---|---|---|---|
| 7,586,239 B1 * | 9/2009 | Li | H03H 9/2436 333/186 |
| 10,468,584 B2 * | 11/2019 | Taniguchi | H03H 9/725 |
| 11,082,029 B2 * | 8/2021 | Kodama | H03H 9/205 |

(Continued)

FOREIGN PATENT DOCUMENTS

| | | |
|---|---|---|
| JP | 2004023593 A | 1/2004 |
| JP | 2017157944 A | 9/2017 |
| WO | 2022044869 A1 | 3/2022 |

*Primary Examiner* — John W Poos

(74) *Attorney, Agent, or Firm* — Withrow & Terranova, P.L.L.C.

(57) ABSTRACT

The present disclosure relates to Surface Acoustic Wave (SAW) devices, including those configured as resonators. The SAW devices will generally include a piezoelectric layer, an interface structure, and an interdigitated transducer. The piezoelectric layer is formed from a piezoelectric material and may be provided by a piezoelectric film that resides over a carrier substrate or a piezoelectric substrate. The piezoelectric layer will have a top surface. The interdigitated transducer has a first pattern and resides over the top surface of the piezoelectric layer. The interface structure has a second pattern that generally corresponds to the first pattern of the interdigitated transducer and resides between the top surface of the piezoelectric layer and the interdigitated transducer.

14 Claims, 15 Drawing Sheets

(58) Field of Classification Search
CPC ........... H03H 9/14538; H03H 9/02102; H03H 9/131; H03H 2003/023; H03H 9/14552
See application file for complete search history.

(56) References Cited

U.S. PATENT DOCUMENTS

| | | | | |
|---|---|---|---|---|
| 2016/0182009 | A1* | 6/2016 | Bhattacharjee .... | H03H 9/02574 310/313 R |
| 2017/0155373 | A1* | 6/2017 | Ruby ................. | H03H 9/02574 |
| 2018/0041187 | A1* | 2/2018 | Yashiro .............. | H03H 9/02574 |

* cited by examiner

SURFACE ACOUSTIC WAVE DEVICE HAVING AN INTERFACE LAYER BETWEEN AN IDT AND A PIEZOELECTRIC LAYER

FIELD OF THE DISCLOSURE

The present disclosure relates to a Surface Acoustic Wave (SAW) device.

BACKGROUND

Surface Acoustic Wave (SAW) devices, such as SAW resonators and SAW filters, are used in many applications such as Radio Frequency (RF) filters. For example, SAW filters are commonly used in wireless receiver front ends, duplexers, and receive filters. The widespread use of SAW filters is due to, at least in part, that fact that SAW filters exhibit low insertion loss with good rejection, can achieve broad bandwidths, and are a small fraction of the size of traditional cavity and ceramic filters. As with any electronic device, the performance of a SAW device is an important parameter that can impact the overall performance of a system. In this regard, there is a need for high performance SAW devices and a continued need to achieve such performance in smaller and smaller devices.

SUMMARY

Those skilled in the art will appreciate the scope of the present disclosure and realize additional aspects thereof after reading the following detailed description of the preferred embodiments in association with the accompanying drawing figures.

The present disclosure relates to Surface Acoustic Wave (SAW) devices, including those configured as resonators. The SAW devices will generally include a piezoelectric layer, an interface structure, and an interdigitated transducer. The piezoelectric layer is formed from a piezoelectric material and may be provided by a piezoelectric film that resides over a carrier substrate or a piezoelectric substrate. The piezoelectric layer will have a top surface. The interdigitated transducer has a first pattern and resides over the top surface of the piezoelectric layer. The interface structure has a second pattern that generally corresponds to the first pattern of the interdigitated transducer and resides between the top surface of the piezoelectric layer and the interdigitated transducer.

The interdigitated transducer and the interface structure may be conductive. In one embodiment, the interface structure is directly on the top surface, and the interdigitated transducer is directly on the interface structure. In other embodiments, there may be intervening layers between piezoelectric layer, the interface structure, and the interdigitated transducer.

In one embodiment, a plurality of elements of the interface structure are wider than corresponding elements of the interdigitated transducer.

In one embodiment, each element of the interface structure is wider than each corresponding element of the interdigitated transducer.

In one embodiment, a plurality of elements of the interface structure are at least 25% wider than corresponding elements of the interdigitated transducer. In one embodiment, a plurality of elements of the interface structure are at least 50% wider than corresponding elements of the interdigitated transducer. In one embodiment, a plurality of elements of the interface structure are at least 75% wider than corresponding elements of the interdigitated transducer.

In one embodiment, the interface structure comprises titanium.

In one embodiment, the SAW device comprises a carrier substrate, and the piezoelectric layer is a piezoelectric film over the carrier substrate.

In one embodiment, at least one dielectric layer is between the piezoelectric film and the carrier substrate.

In one embodiment, the piezoelectric layer is a piezoelectric substrate.

In one embodiment, the SAW device comprises at least one dielectric layer over the top surface, the interdigitated transducer, and at least certain portions of the interface structure.

In one embodiment, the interdigitated transducer has a thickness greater than a thickness of the interface structure.

In one embodiment, the SAW device forms a SAW resonator.

In one embodiment, a plurality of elements of the interface structure are wider than corresponding elements of the interdigitated transducer; the SAW device forms a SAW resonator; the interface structure comprises titanium; and the interdigitated transducer has a thickness greater than a thickness of the interface structure.

A method of fabricating a Surface Acoustic Wave (SAW) device may comprise:

- providing a piezoelectric layer having a top surface;
- providing an interdigitated transducer having a first pattern and over the top surface; and
- providing an interface structure having a second pattern that corresponds to the first pattern and residing between the top surface and the interdigitated transducer, wherein the interface structure is conductive.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
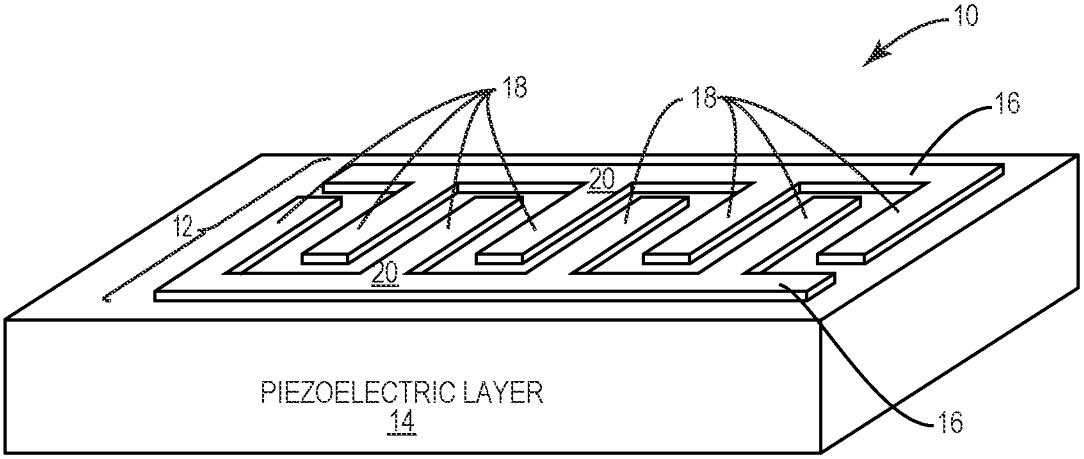
FIG. 1A RELATED ART
FIG. 1A is an isometric view of a Surface Acoustic Wave (SAW) device of the related art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term “and/or” includes any and all combinations of one or more of the associated listed items.

It should also be understood that when an element is referred to as being “on,” “over,” “connected,” or “coupled” to another element, it can be directly on, over, connected, or coupled to the other element or intervening elements may be present. In contrast, when an element is referred to as being “directly connected” or “directly coupled” to another element, there are no intervening elements present.

It should be understood that, although the terms “upper,” “lower,” “bottom,” “intermediate,” “middle,” “top,” and the like may be used herein to describe various elements, these elements should not be limited by these terms. These terms are only used to distinguish one element from another. For example, a first element could be termed an “upper” element and, similarly, a second element could be termed an “upper” element depending on the relative orientations of these elements, without departing from the scope of the present disclosure.

The terminology used herein is for the purpose of describing particular embodiments only and is not intended to be limiting of the disclosure. As used herein, the singular forms “a,” “an,” and “the” are intended to include the plural forms as well, unless the context clearly indicates otherwise. It will be further understood that the terms “comprises,” “comprising,” “includes,” and/or “including” when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

The present disclosure relates to Surface Acoustic Wave (SAW) devices, including those configured as resonators. The SAW devices will generally include a piezoelectric layer, an interface structure, and an interdigitated transducer. The piezoelectric layer is formed from a piezoelectric material and may be provided by a piezoelectric film that resides over a carrier substrate or a piezoelectric substrate. The piezoelectric layer will have a top surface. The interdigitated transducer has a first pattern and resides over the top surface of the piezoelectric layer. The interface structure has a second pattern that generally corresponds to the first pattern of the interdigitated transducer and resides between the top surface of the piezoelectric layer and the interdigitated transducer. The interdigitated transducer and the interface structure are electrically conductive.

In one embodiment, the interface structure is directly on the top surface, and the interdigitated transducer is directly on the interface structure. In other embodiments, there may be intervening layers between piezoelectric layer, the interface structure, and the interdigitated transducer.

In one embodiment, a plurality of elements of the interface structure are either as wide or wider than corresponding elements of the interdigitated transducer. Further, the interdigitated transducer may have a thickness greater than a thickness of the interface structure.

Figure 1B:
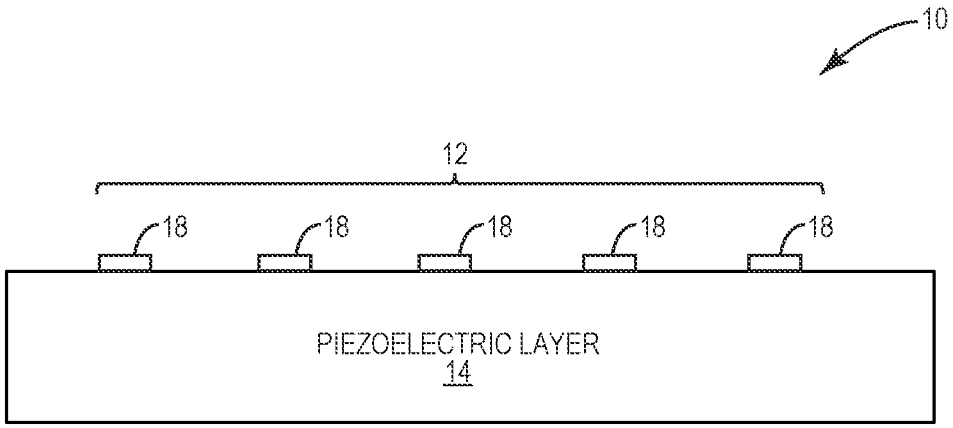
FIG. 1B RELATED ART
FIG. 1B is cross-sectional view of the SAW device of FIG. 1.
Figure 1C:
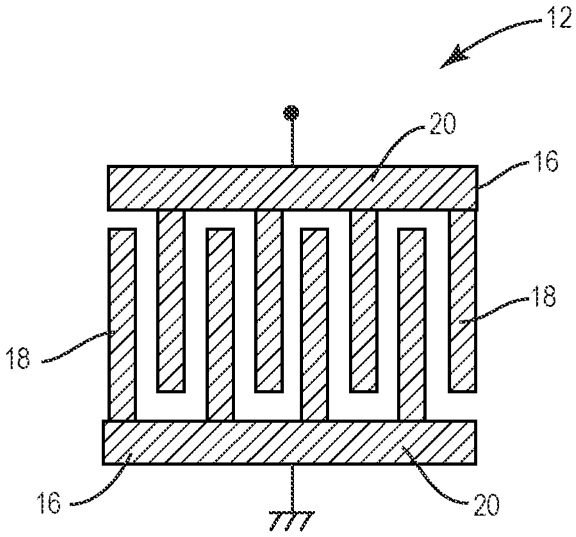
FIG. 1C RELATED ART
FIG. 1C is a top view of an IDT of the SAW device of FIG. 1.

Before describing embodiments of the present disclosure, a general overview of a typical SAW device 10 is provided with reference to FIGS. 1A-1C. The SAW device 10 has at least one interdigitated transductor 12 on the surface of a piezoelectric layer 14 and is configured as a resonator. The illustrated IDT 12 includes two interdigitated electrodes 16, each of which includes a plurality of parallel fingers 18 that extend from a bus bar 20. FIG. 1C is a top view of the IDT 12 of the SAW device 10 illustrated in FIGS. 1A and 1B.

SAW devices 10 use the propagation of acoustic waves at the surface of a piezoelectric layer 14. A voltage is applied between the two electrodes 16 to create electrical fields and generate surface acoustic waves along the surface of the piezoelectric layer 14 by the piezoelectric effect.

Figure 2:
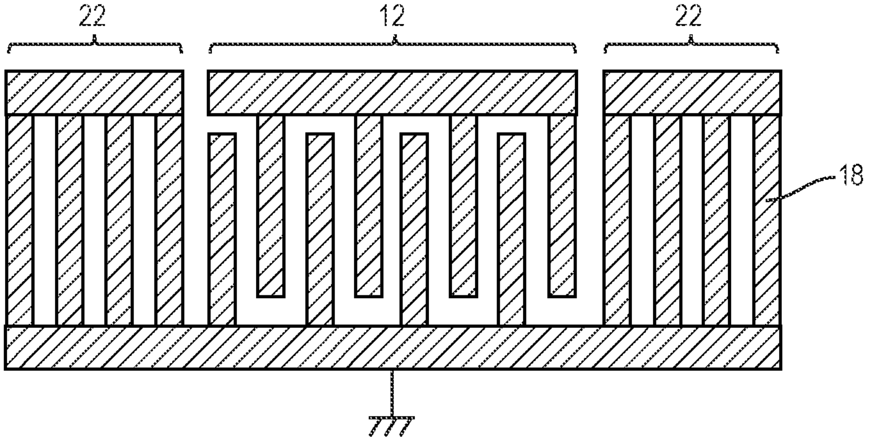
FIG. 2 RELATED ART
FIG. 2 is a top view of an IDT structure having an IDT between two reflectors according to the related art.

FIG. 2 is a top view of an alternative IDT configuration. In this configuration, the SAW device 10 includes an IDT 12 inserted between two gratings 22. The two gratings 22 act as reflectors and define an (acoustic) cavity. The IDTs 12 and the gratings 22 may share elements or be separate from one another. The IDTs 12, gratings 22, and like conductive structures that are designed to excite, affect, and/or react to SAWs are collectively referred to as IDT elements that may have fingers 18, bus bars 20, and/or electrodes 16. Those skilled in the art are aware of the various configurations of these IDT elements, which are considered a part of the current disclosure.

Figure 3:
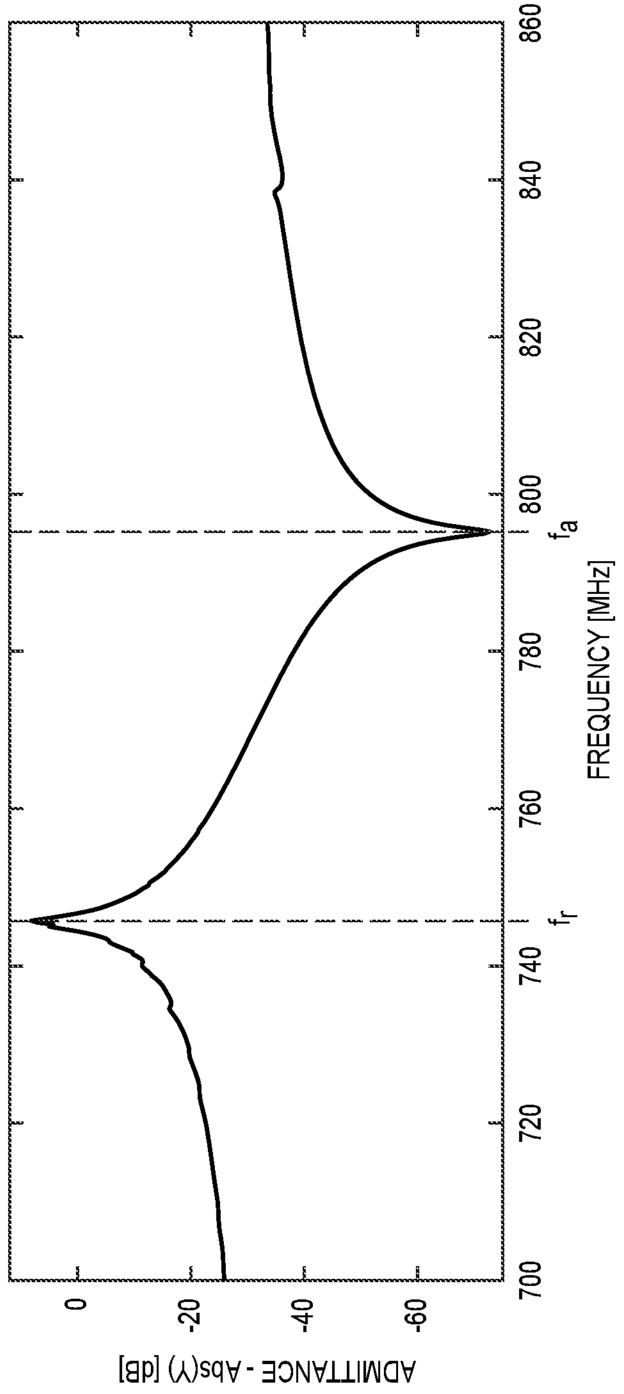
FIG. 3 illustrates an exemplary admittance response of a SAW device configured as a resonator.

FIG. 3 is a graph of a typical admittance of a SAW device 10, which is configured as a resonator. FIG. 3 is in log scale with a given scaling factor. At resonance frequency, $f_r$, the admittance Y of the SAW resonator is close to zero and the SAW resonator acts as a short circuit. At the antiresonance frequency, $f_a$, the admittance of the SAW resonator is very low, and the SAW resonator acts as an open circuit. Using these properties, it is possible to design ladder filters using SAW devices 10 and other passive components.

Figure 4:
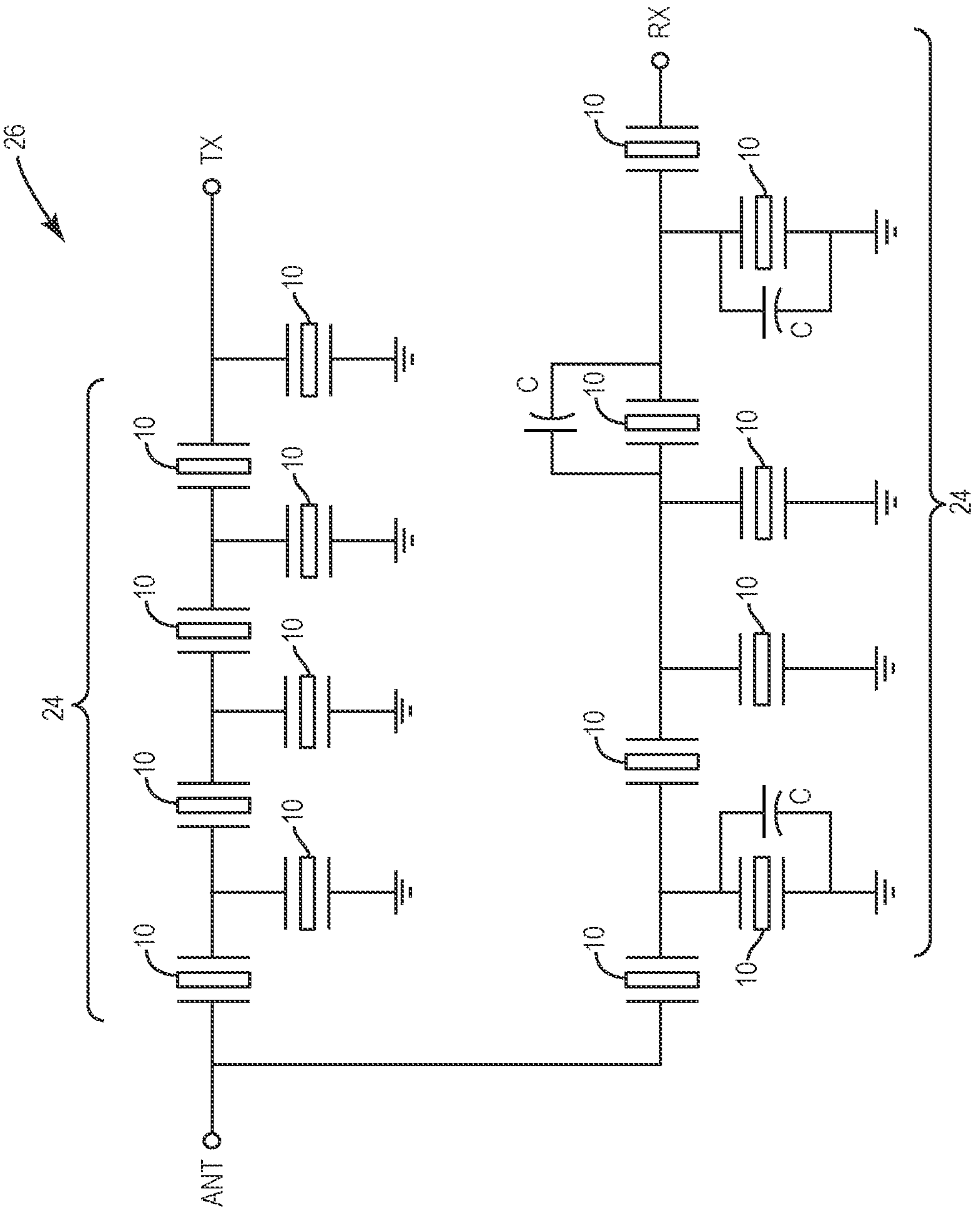
FIG. 4 illustrates ladder networks provided in transmit and receive paths of a communication device according to the related art.

An exemplary circuitry that employs two ladder filters 24 is shown in FIG. 4. The illustrated circuit is a transmit/receive (TX/RX) circuit 26 (i.e. duplexer), wherein one ladder filter 24 extends between an antenna port (ANT) and a transmit node (TX) and another ladder filter 24 extends between the antenna port (ANT) and a receive node (RX) for a communication circuit (not shown). As shown, several SAW devices 10 are connected in shunt and series fashion and may have additional passive devices, such as the illustrated capacitors C, to help shape the response of the respective ladder filter 24.

In general, each ladder filter 24 is designed such that the shunt (resonator) SAW devices 10 have an antiresonance frequency, fa, close to the center frequency of the ladder filter 24. The series (resonator) SAW devices 10 are designed to have their resonance frequency, fr, close to the center frequency of the ladder filter 24. Thus, at or around the center frequency, the shunt SAW devices 10 act as open circuits and the series SAW devices act as short circuits, and there is a low impedance electrical connection providing a passband through the ladder filter 24. At their resonance frequency, the shunt SAW devices 10 act as short circuits, producing a notch in the transfer function of the ladder filter 24 below the passband. Similarly, at their antiresonance frequency, the series resonators act as open circuits and produce a notch above the passband. In certain embodiment, the ladder filters 24 may have several resonance frequencies for the shunt SAW devices and antiresonance frequencies for the series resonators. Also, the design may include several lumped elements such as capacitance or inductances that shift the effective resonance frequencies of the resonators.

In certain implementations, capacitors C are added in parallel with certain SAW devices 10, to reduce the effective coupling. Such capacitors C are typically implemented as "IDT capacitors" which are a type of SAW resonator typically with resonator frequencies above the passband. One typical reason for this is to achieve a smaller effective coupling of the combined structure, which corresponds to a quicker transition between resonance and antiresonance, which can be used for achieving a steeper filter skirt. The drawback of having to add additional capacitors C is that they need extra space and add unwanted acoustic modes and losses.

Figure 5:
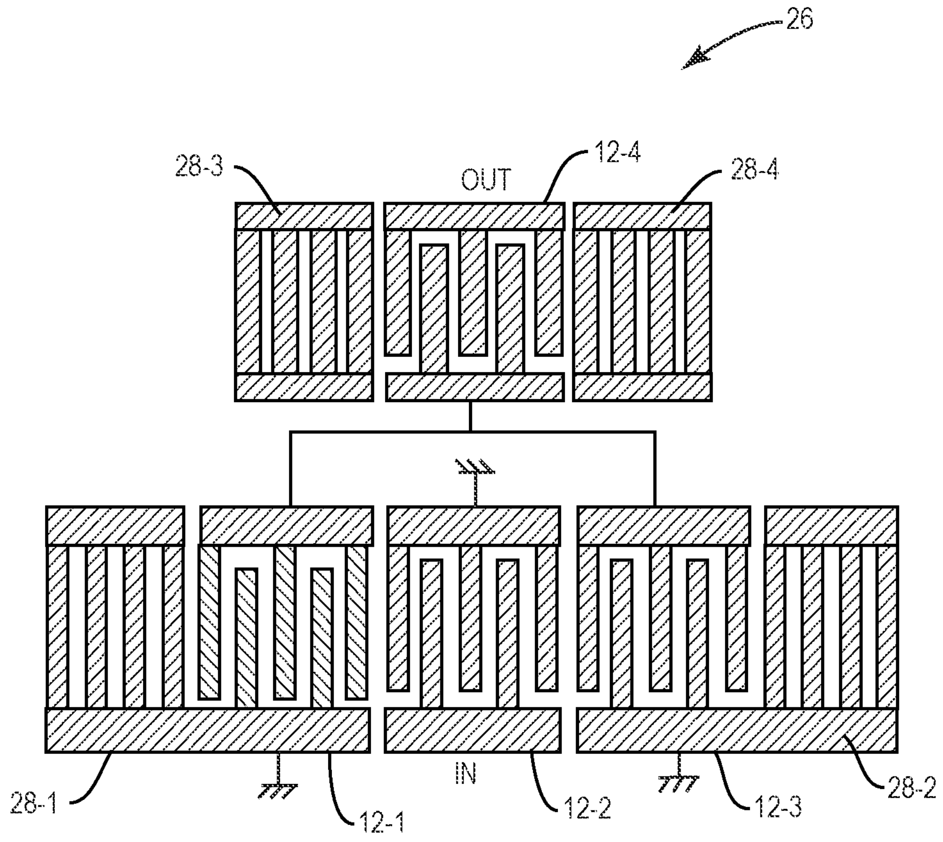
FIG. 5 is a diagram showing an example of a coupled resonator filter cascaded with a resonator according to the related art.

In addition to ladder filters, it is possible to design so-called Coupled Resonator Filters (CRFs) or Double Mode SAW filters (DMSs). Instead of using SAW resonators as circuit elements, CRFs are designed by placing several transducers between two reflective gratings. In the example CRF 24 shown in FIG. 5, three IDTs 12-1 through 12-3 are placed between two gratings 28-1 and 28-2, which act as reflectors. The center IDT 12-2 is connected to the input signal, whereas the two external IDTs 12-1 and 12-3 are connected in parallel. The cavity between the two gratings 28-1 and 28-2 has several longitudinal modes. By choosing a symmetric arrangement of the IDTs 12-1 through 12-3, only the symmetric longitudinal modes are excited. This type of CRF normally uses mainly two longitudinal modes to couple the input IDT 12-2 to the output IDTs 12-1 and 12-3. The passband width is proportional to the frequency difference of these two modes. The coupling factor defines the possibility to electrically match the filter. As for ladder filters, a larger coupling factor allows a wider relative bandwidth. In the example of FIG. 5, the output IDTs 12-1 and 12-3 of the CRF stage are connected to a series resonator formed by, in this example, an IDT 12-4 and gratings 28-3 and 28-4.

Figure 6:
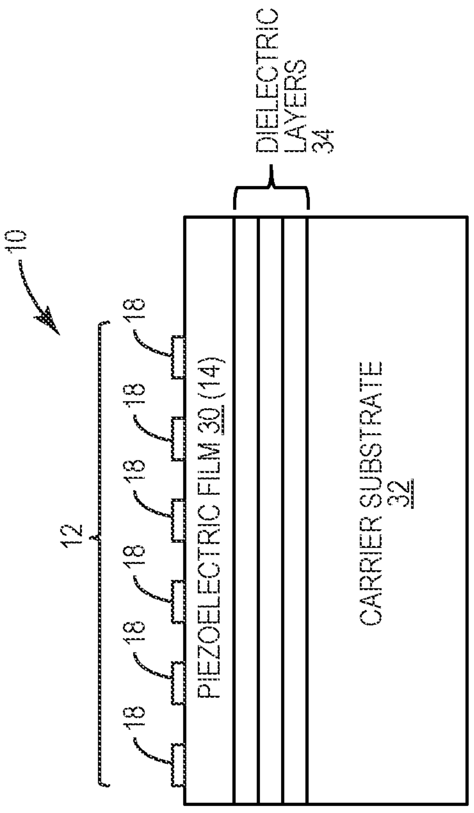
FIG. 6 RELATED ART
FIG. 6 is a diagram illustrating a SAW device employing a carrier substrate, a piezoelectric film as the piezoelectric layer, and optional dielectric layers according to the related art.

A SAW device 10 of a first type is shown in FIG. 6, wherein the piezoelectric layer 14 is provided by a piezoelectric film 30, which is provided over a carrier substrate 32. One or more dielectric layers 34 may be provided between the piezoelectric film 30 and the carrier substrate 32. IDT elements of IDT 12 are formed directly on the piezoelectric film 30. As illustrated, the cross-sections of the fingers 18 of an IDT 12 are shown directly on the piezoelectric film 30.

Figure 7:
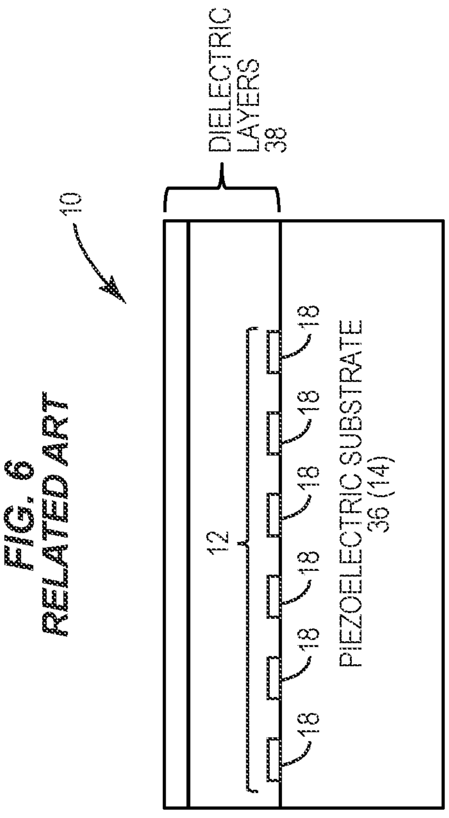
FIG. 7 RELATED ART
FIG. 7 is a diagram illustrating a SAW device employing a piezoelectric substrate as the piezoelectric layer, and optional dielectric layers according to the related art.

A SAW device 10 of a second type is shown in FIG. 7, wherein the piezoelectric layer 14 is provided by a piezoelectric substrate 36 instead of a piezoelectric film 30 that is provided over a carrier substrate 32, as in FIG. 6. IDT elements of IDT 12 are formed directly on the piezoelectric substrate 36. As illustrated, the cross-sections of the fingers 18 of an IDT 12 are shown directly on the piezoelectric substrate 36. One or more dielectric layers 38 may be provided over the piezoelectric substrate 36 and the IDT 12.

Figure 8:
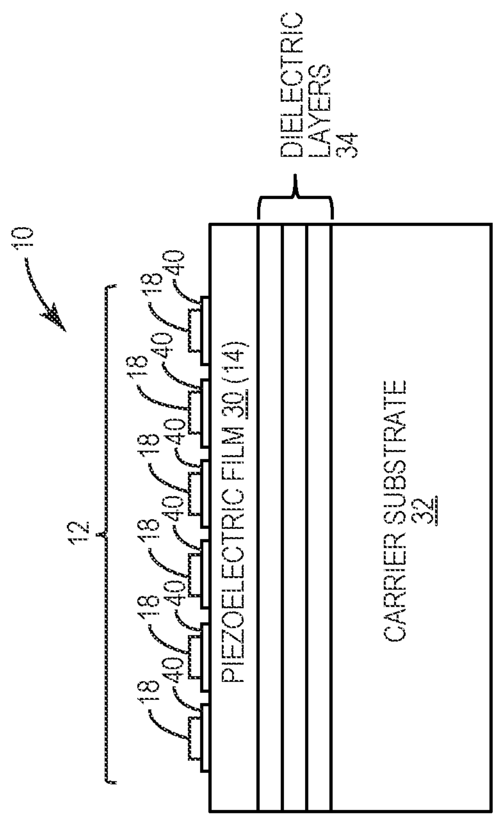
FIG. 8 is a diagram illustrating a SAW device employing a carrier substrate, a novel interface structure, a piezoelectric film as the piezoelectric layer, and optional dielectric layers according to one embodiment of the disclosure.
Figure 9:
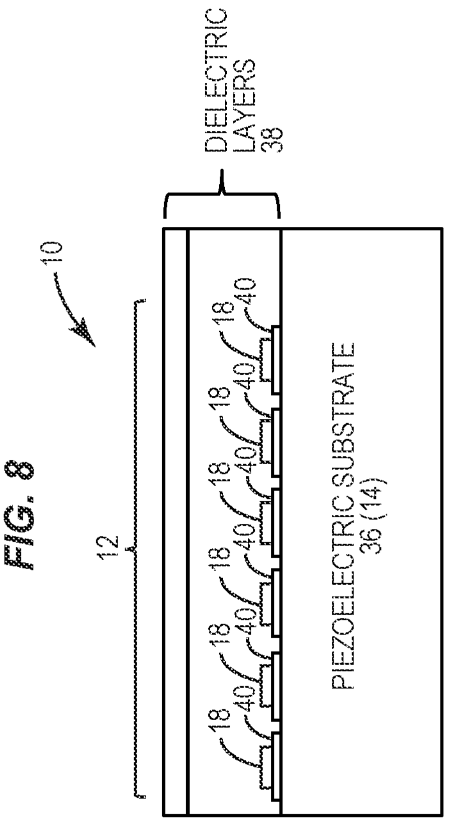
FIG. 9 is a diagram illustrating a SAW device employing a piezoelectric substrate as the piezoelectric layer, a novel interface structure, and optional dielectric layers according to one embodiment of the disclosure.
Figure 10:
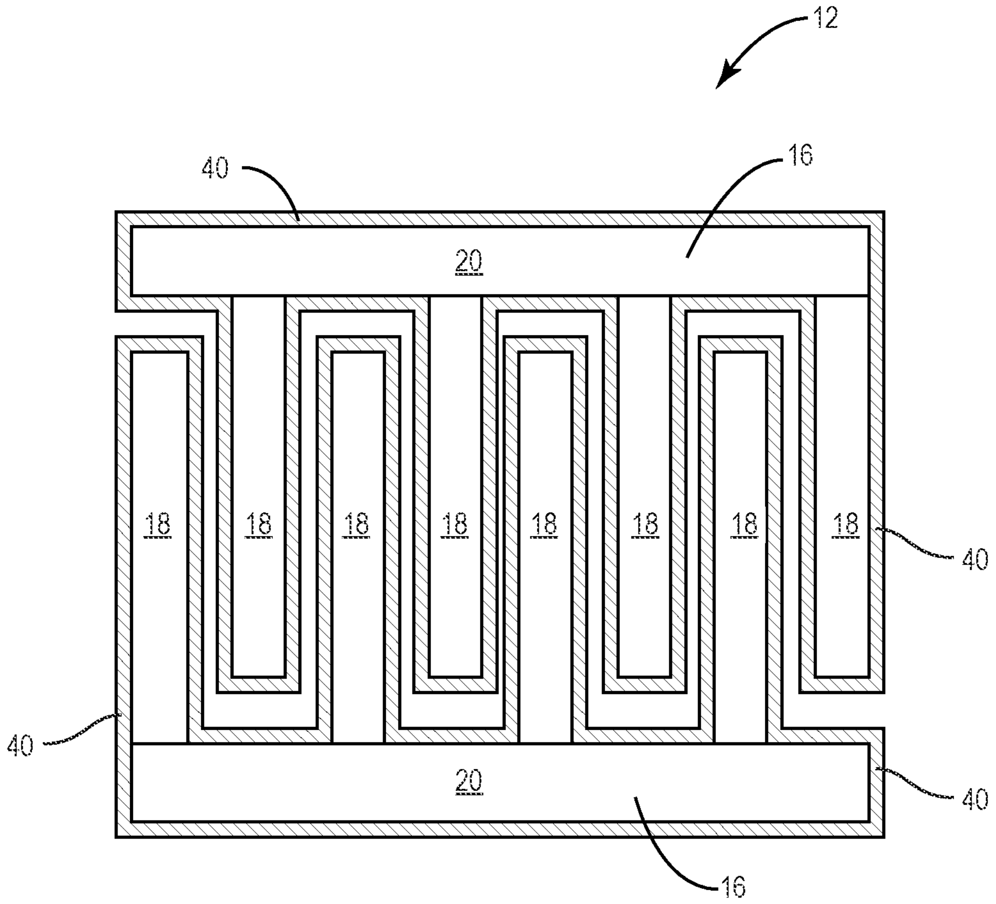
FIG. 10 is a top view of an exemplary IDT and the novel interface structure according to one embodiment of the disclosure.

Starting with reference to FIGS. 8, 9 and 10, the concepts of the present disclosure are described. Instead of providing the IDTs 12 directly on the piezoelectric layer 14, such as the piezoelectric film 30 of FIG. 6 or the piezoelectric substrate 36 of FIG. 7, a conductive interface structure 40 is provided between the IDTs 12 and the piezoelectric layer. The interface structure 40 will have the same general pattern that corresponds to the overlaying IDTs 12, but segments of the interface structure 40 will have lateral dimensions that are the same or greater than the corresponding segments of the overlaying IDTs 12. The segments of the IDTs 12 will be over or directly on corresponding segments of the interface structure 40. The interface structure 40 will be over or directly on the top surface of the piezoelectric layer 14.

The carrier substrate 32 may include silicon (Si), silicon carbide, quartz, sapphire, diamond, and the like. Exemplary thicknesses may include 100-300 μm, 300-500 μm, and 500-750 μm. The piezoelectric layer 14, including the piezoelectric film 30 or piezoelectric substrate 36, may be formed from lithium niobate (LN/LiNbO3), lithium tantalate (LT/LiTaO3), aluminum nitride (AlN), Scandium Aluminum Nitride (ScAlN) and the like. Exemplary thicknesses may include 100-250 nm, 250-500 nm, and 500-1000 nm. The interface structure 40 may be formed from one or more layers of the same or different conductive materials, such as titanium (Ti), nickel (Ni), chromium (Cr), zirconium (Zr), magnesium (Mg), aluminum (Al) or a compound containing the same. Exemplary thicknesses may include 5-15 nm, 15-50 nm, and 50-100 nm. Dielectric layers 34, 38 may include one or dielectric materials such as, for example, silicon oxide (SiO), silicon nitride (SiN), and aluminum oxide (Al2O3). All of the materials above are exemplary and non-limiting examples. Exemplary thickness may include 10-500 nm, 500-1000 nm, and 1000-2000 nm.

Figure 11:
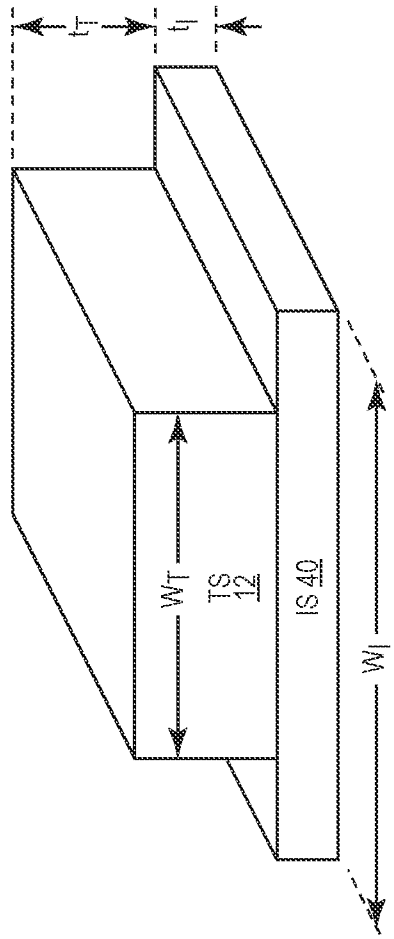
FIG. 11 is an isometric view of corresponding segments of an exemplary IDT and the novel interface structure according to one embodiment of the disclosure.
Figure 12:
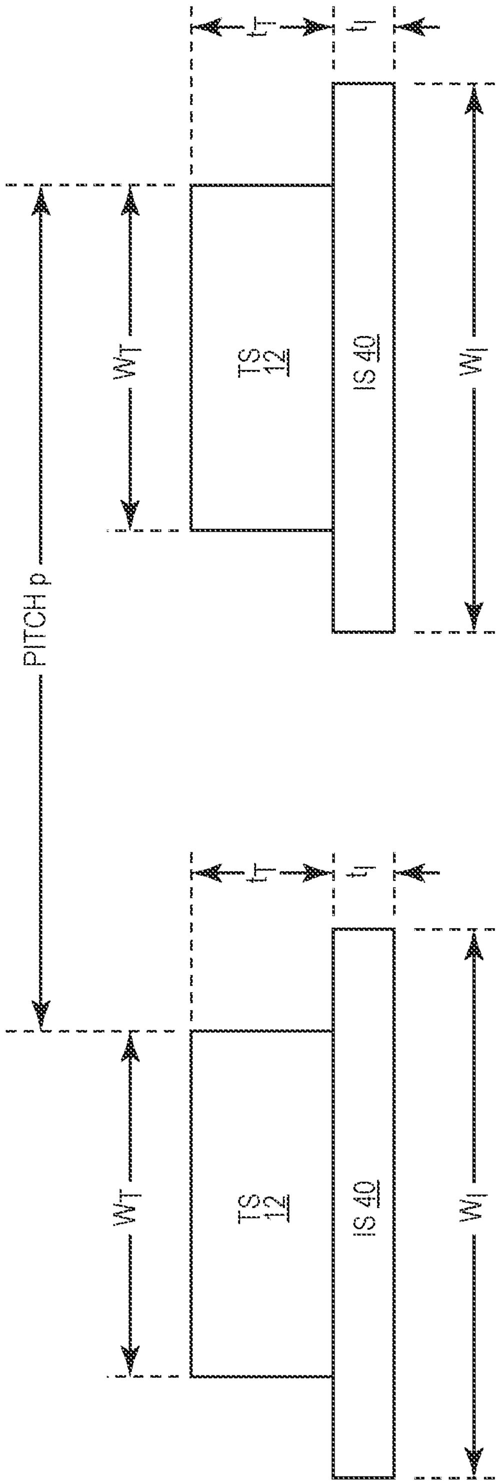
FIG. 12 is a cross-sectional view of corresponding segments of an exemplary IDT and the novel interface structure according to one embodiment of the disclosure.

In FIGS. 11 and 12, segments of the interface structure 40 are wider than corresponding segments of the IDT elements. FIG. 12 illustrates the width differences. The interface segments IS of the interface structure 40 have a width $W_I$, and the transducer segments TS of the IDT 12 (or other IDT elements) have a width $W_T$, wherein the width $W_I$ is greater than or equal to width $W_T$. In certain embodiments, width $W_I$ is at least 10%, 20%, 25%, 50%, 75%, 80%, or 100% greater than width $W_T$. Upward bounds for each of these ranges may be, but is not limited to, 100%, 200%, and 300%. The thickness of the transducer segments TS may also be greater than the thickness of the interface segments IS, wherein thickness $t_T$ is at least 10%, 20%, 25%, 50%, 75%, 80%, 100%, 200%, 300%, 400%, and 500% greater than thickness $t_I$. Upward bounds for each of these ranges may be, but is not limited to, 500%, 1000%, and 10000%.

Employing the interface structure 40 provides a way to tune the coupling factor for each SAW device 10 individually, without having to add IDT capacitors or the like. An additional benefit of the interface structure 40 is that using the interface structure 40 saves space on filter dies because the capacitors C are no longer needed or the number of capacitors C is significantly reduced. The interface structure 40 is a conductive layer and electrically well connected to the IDT 12, but leads to minimal mass loading and minimal additional overlap of the acoustic mode with lossy material, hence avoiding losses. The concepts presented here may generally be used for various SAW technologies in a comparable fashion, for low-band (LB), mid-band (MB), as well as high-band (HB) applications, which need low insertion loss and steep filter skirts.

The IDT 12 is defined by the choice of a material (metal) stack, electrode thickness and shape, and pitch, p, and IDT duty factor ($DF_{IDT}$), which is defined as the ratio of the metal finger width (i.e. $W_T$) to the pitch, p. The wavelength λ of the SAW wave in propagation direction is λ=2 p. A typical value for an optimized resonator stack is $DF_{IDT}$=50%, in one embodiment.

The interface structure 40, in its most simple embodiment, can be described by three properties: material type, layer thickness $t_I$, and interface structure duty factor $DF_I=W_I/p$. The material has a good electrical conductivity and low mechanical damping. For illustration purposes, a thin layer of titanium (Ti) may be used in a 3D FEM simulation with 2-dimensional periodicity. The results are normalized to a unit cell of 1λ×1λ.

Figure 13:
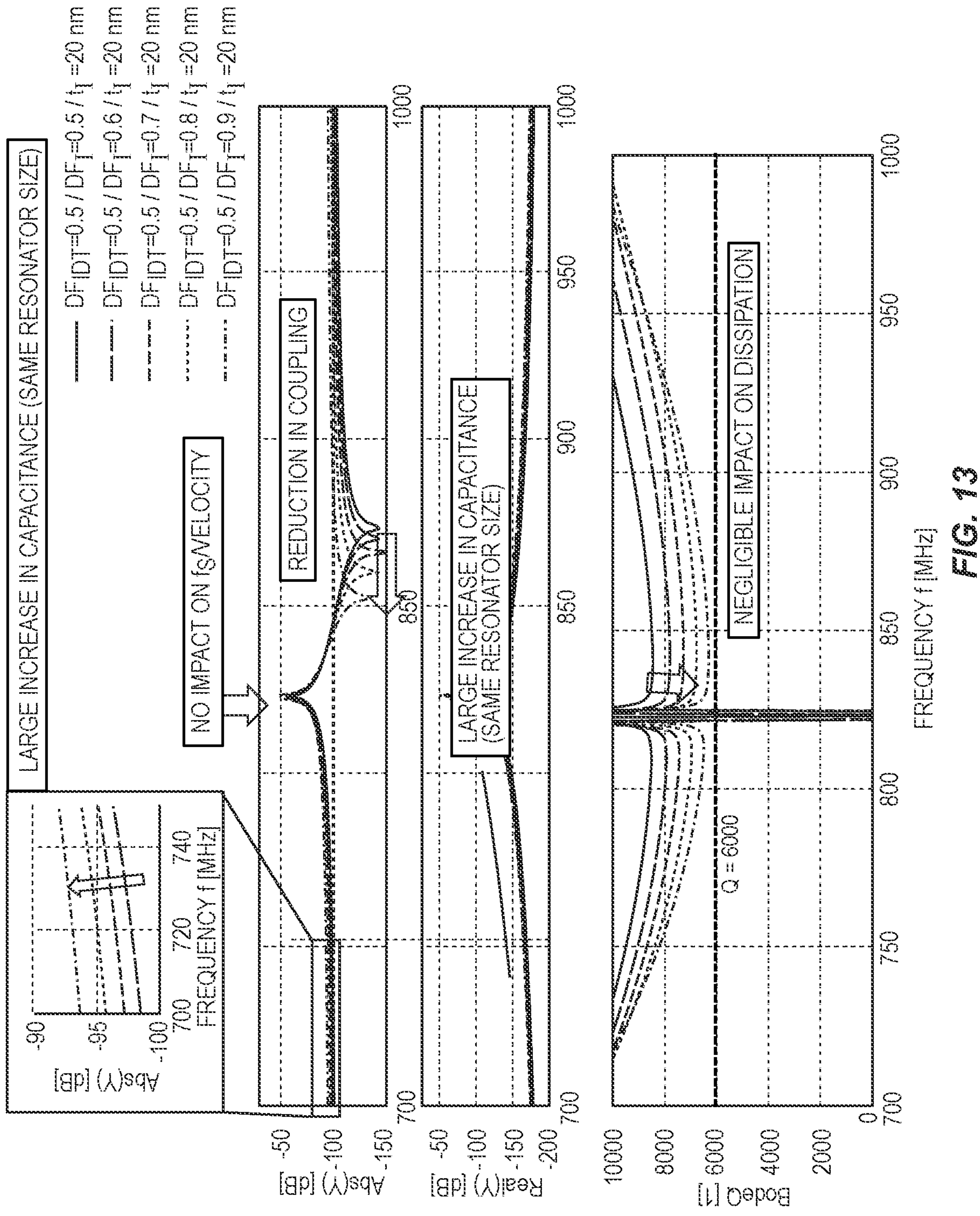
FIG. 13 illustrates finite element method (FEM) simulation results showing the impact of providing the novel interface structure between the piezoelectric layer and the IDT according to one embodiment of the disclosure.

FIG. 13 shows the resulting simulated admittance, conductance and BodeQ for $DF_{IDT}$=50% and a Ti interface structure of $t_I$=20 nm and $DF_I$ values ranging from 50% to 90%. When the segments of the IDT 12 are the same width as the corresponding segments of the interface structure 40 ($DF_{IDT}=DF_I$) this would be an interface structure (or underlayer) of equal width as the IDTs. The changes in resonator properties may be normalized to this "equal width" case to clearly show the benefits of using the concepts disclosed herein. As intended, with increasing $DF_I$ the coupling reduces while the capacitance significantly increases. The only loss mechanism considered in the simulation is damping in the metal. This is intentional, in order to see how large the quality factor Q could be, if all other loss mechanisms, such as dielectric losses, finite resistance of the IDTs and energy leakage in various directions, are minimized. In such a case, damping in the metal would be the leading source of what limits Q. The FEM simulation results show that for typical assumptions of Ti material Q, only a small decrease in the resonator's BodeQ occurs, which can be explained by the only slight increase in overlap of the acoustic mode with the added interface structure. Hence when the resonator Q is limited by other loss mechanism to values below 6000, there is effectively no increase in dissipation due to this added layer.

The results in FIG. 13 illustrate that a tunable coupling factor is possible without requiring extra space, but rather saving space at the same time due to the increased capacitance for the same resonator area, without degrading the qualify factor.

To quantify how much coupling reduction is possible, an exemplary low band SAW filter design is used as reference wherein certain IDT capacitors are added in parallel to series resonators in order to reduce the effective coupling and/or increase the steepness of a filter skirt.

Figure 14:
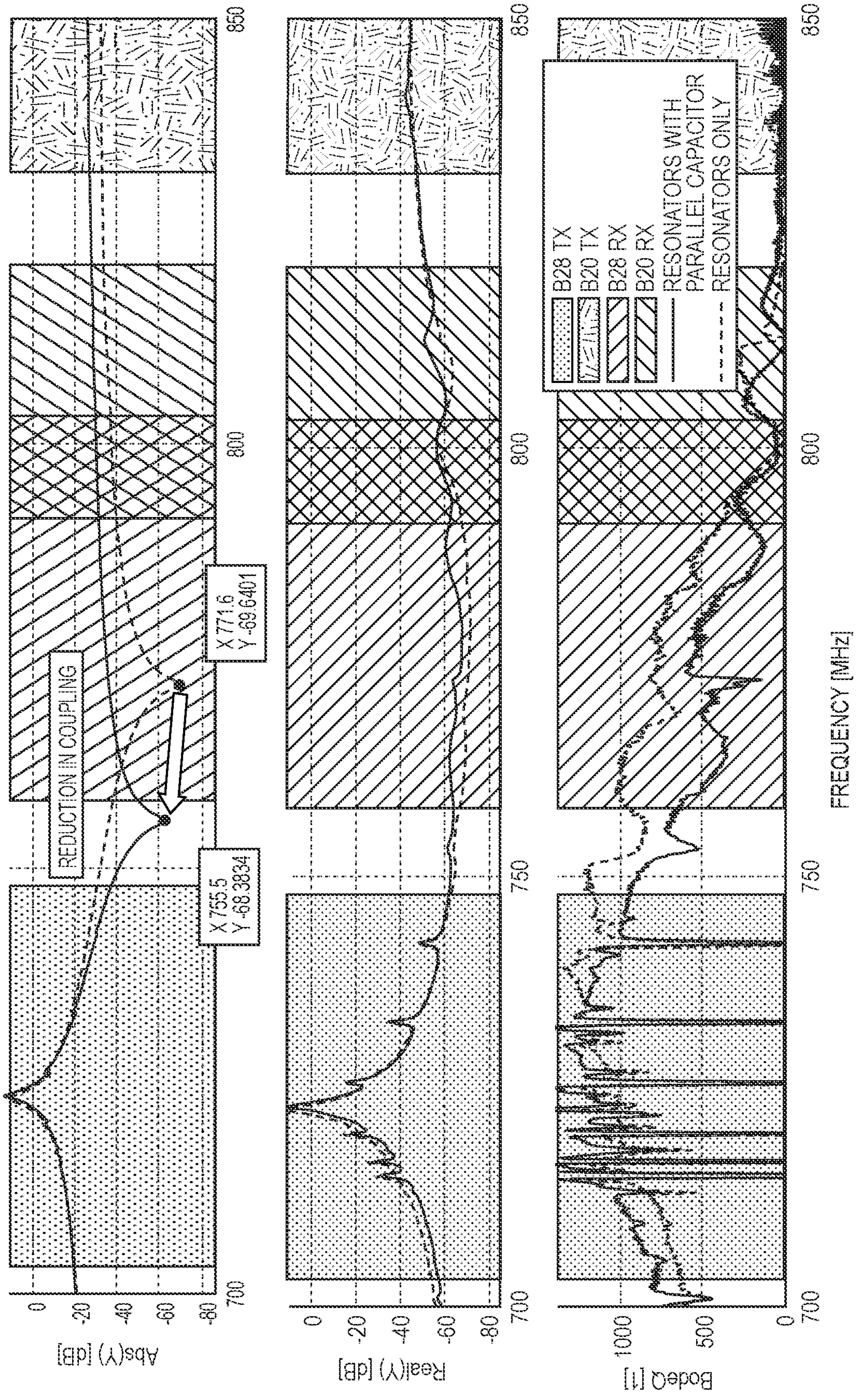
FIG. 14 illustrates an exemplary reduction in effective coupling k2e in actual filter designs for product development by a parallel capacitor.

As seen in FIG. 14, while the original coupling of the resonator is 14.6%, the coupling of the combined structure is 10%, which means 68.5% of the original coupling or a 31.5% intentional reduction in coupling. Achieving this is important enough for the filter performance that the space penalty is accepted. Reducing the space needed for this construct would be valuable.

To estimate how much space saving can be achieved with the concepts disclosed herein, the changes in capacitance and coupling of the simulated resonator responses shown in FIG. 13 are plotted against each other.

Figure 15A:
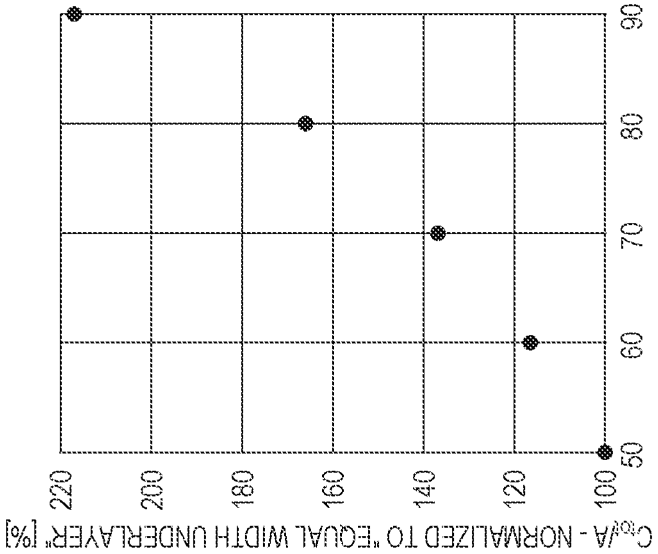
FIGS. 15A-15C show the impact of increasing the duty factor of the interface structure.
Figure 15B:
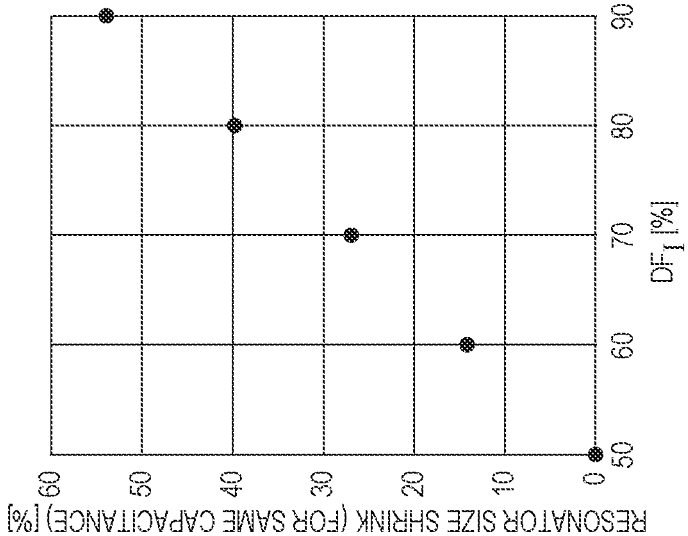
Figure 15C:
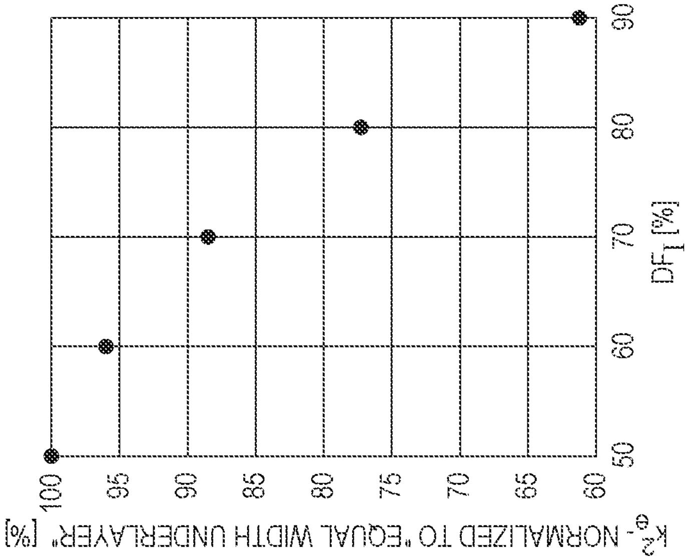
Figure 15E:
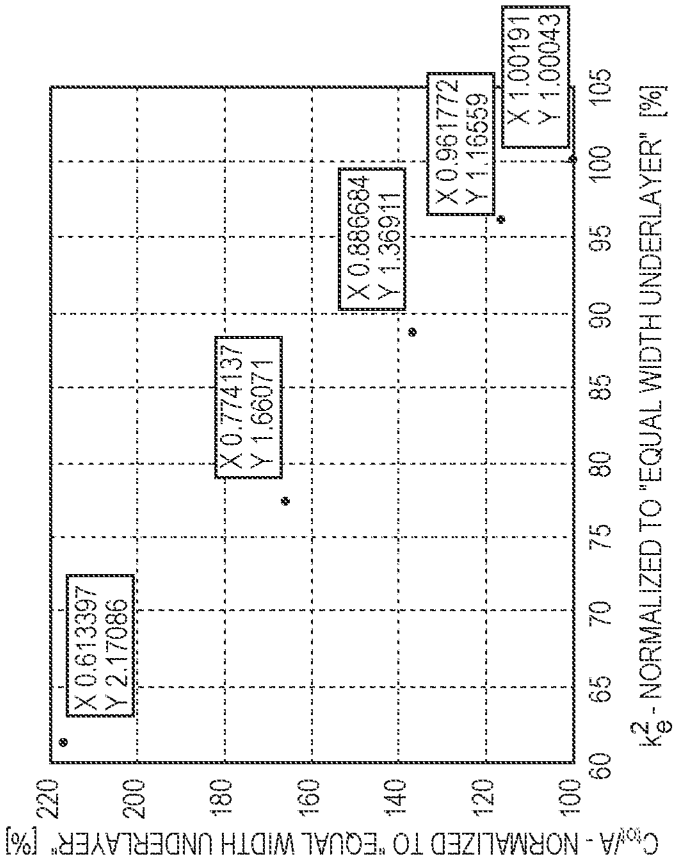
FIGS. 15D and 15E illustrate a selectable and desirable increase in capacitance per area when implementing the novel interface structure according to one embodiment of the disclosure.
Figure 15D:
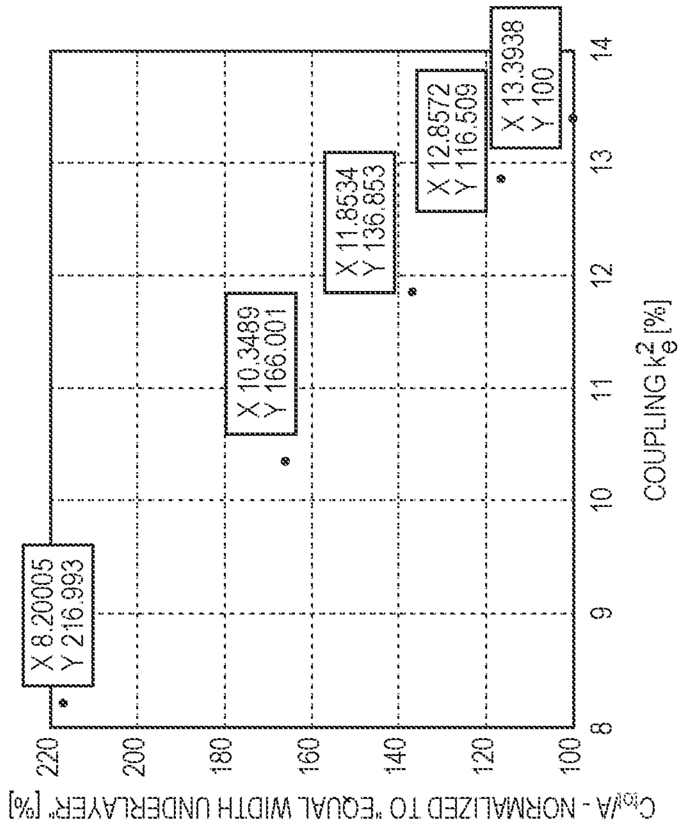

FIGS. 15A-15C show the impact of increasing the duty factor of the interface structure 40. Results are normalized to $DF_T=DF_I$=50%. When increasing $DF_I$, there is a significant increase in capacitance per area (FIG. 15A). This can lead to a significant reduction in resonator size, which is needed to implement the resonator with the same capacitance (FIG. 15B). The effective coupling is reduced (FIG. 15C), which is the same as a capacitor being placed in parallel with a resonator. FIG. 15D shows the combined effect of increase in capacitance per area and reduction of effective coupling when increasing $DF_I$ for an explicit stack and use case. FIG. 15E shows the result, normalized to a resonator where the segments of the IDT 12 are the same width as the corresponding segments of the interface structure 40 ($DF_{IDT}=DF_I$=50%). This would imply Ti interface structure 40 of the same width below the IDTs 12. When adding the new degree of freedom of structuring a wider interface structure 40, a large increase in capacitance can be achieved when trading in some amount of the coupling.

The following are two cases from the graph that serve to explain the changes in resonator properties.

With further reference to FIGS. 15A-15C, for IDT segments (12) with $DF_{IDT}$=50%, if the interface structure segments (40) are wider with $DF_I$=70% the capacitance increases by 137%, which translates (1/1.37=0.73) into 27% reduction in needed resonator size for implementing the same capacitance. The corresponding coupling reduces to 89% of the original value.

For IDT segments (12) with $DF_{IDT}$=50%, if the interface structure segments (40) are wider with $DF_I$=80% the capacitance increases by 166%, which translates (1/1.66=0.6) into 40% reduction in needed resonator size for implementing the same capacitance. The corresponding coupling reduces to 77% of the original value.

The example shown in FIG. 14 (68.5% of the original coupling) highlights that case 2 (77% of the original coupling) is a realistic intentional coupling reduction used in actual SAW filter designs for products. With the concepts provided herein not only the resonator area can be reduced by 40%, but also the IDT capacitor is not needed, which translates to significant space savings for the overall filter design.

The space-saving advantage may be used to reduce the die size and hence reduce the footprint in the filter and/or the footprint of the module, as well as cost per die. Other options include using the freed-up space to add more functional elements to the filter topology (e.g. adding another ladder stage) or to increase the width of routing traces for reduced electrical losses or add additional pillars to reduce the temperature under power. This can lead to improved filter performance.

Figure 16:
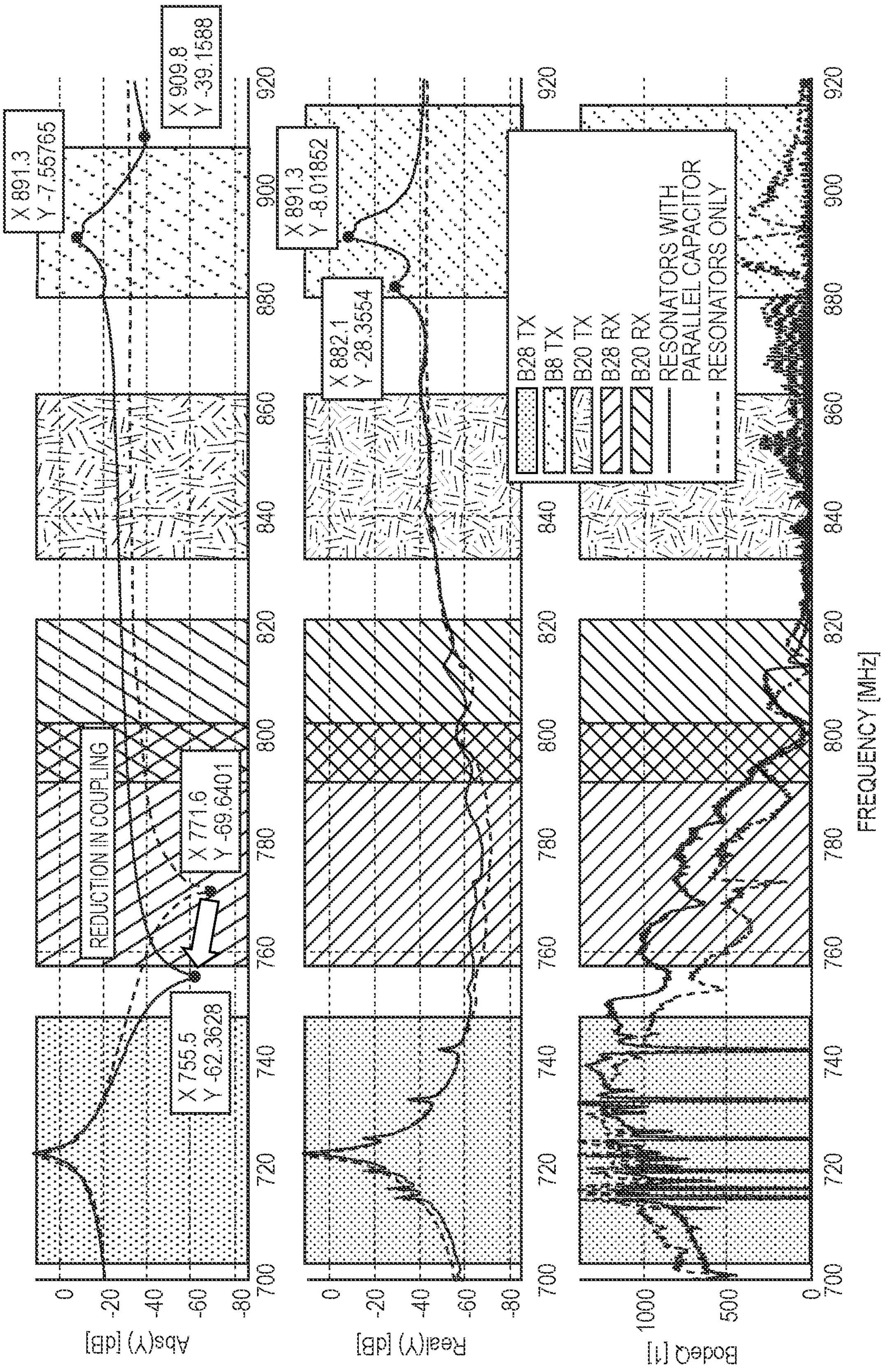
FIG. 16 is a comparison of the response of a SAW resonator interface structure versus a SAW resonator in parallel with an IDT capacitor according to one embodiment of the disclosure.

Those skilled in the art will recognize that "IDT capacitors" are SAW resonators of low quality (e.g. due to omitting acoustic reflectors) which come with additional losses and un-wanted acoustic modes. In filter design these acoustic modes are typically placed in frequency above the filter passbands by using small pitches. The limit to how far above the filter passband these spurious acoustic features can be placed is often limited by the critical feature sizes available to the combination of stack, toolsets, and processes. The responses of the IDT capacitors typically fall into adjacent bands, which can make multiplexing of such SAW filters and carrier aggregation (CA) infeasible. FIG. 16 shows an example where multiplexing of a B28 fullband Tx/(B28+B20)Rx/B20 Rx triplexer with B8 would be problematic, due to the IDT capacitor's spurious acoustic modes (SAMs) falling into B8 Tx, which is a potential low-low CA application case. The disclosed concepts help designers avoid such spurious modes. Hence not only size reduction is achieved but also potential issues for multiplexing are avoided at the same time.

The same logic and principles do not only apply to the shown low-band examples, but are also applicable to mid-band and high-band IDT-based acoustic filters, where higher order multiplexing and various carrier aggregation cases are already the challenging reality. As multiplexing and carrier aggregation cases are ever increasing in modern handsets, new methods which enable to adjust resonator coupling, while avoiding the need for extra space and un-wanted acoustic behavior are needed.

Figure 17:
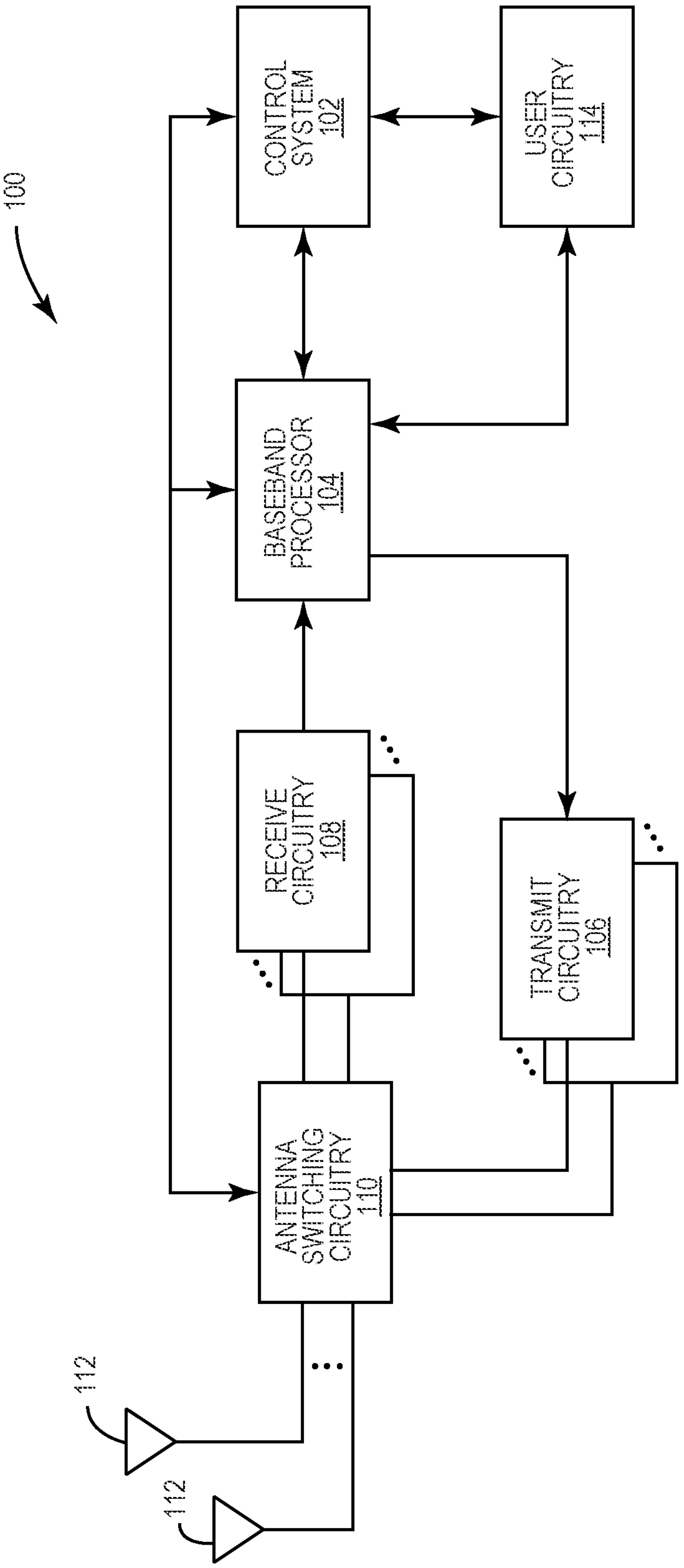
FIG. 17 is a block diagram illustrating a mobile terminal according to one embodiment of the disclosure.

With reference to FIG. 17, the concepts described above may be implemented in various types of user elements 100, such as mobile terminals, smart watches, tablets, computers, navigation devices, access points, and like wireless communication devices that support wireless communications, such as cellular, wireless local area network (WLAN), Bluetooth, and near field communications. The user elements 100 will generally include a control system 102, a baseband processor 104, transmit circuitry 106, receive circuitry 108, antenna switching circuitry 110, multiple antennas 112, and user interface circuitry 112. In a non-limiting example, the control system 102 can be a field-programmable gate array (FPGA) or an application-specific integrated circuit (ASIC), as an example. In this regard, the control system 102 may include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter of the receive circuitry 108 cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC). The SAW devices 10 of the present disclosure may be implemented in various parts of the user elements 100, including the transmit circuitry 106, the receive circuitry 108, and the antenna switching circuitry 110.

The baseband processor 104 processes the digitized received signal to extract the information or data bits conveyed in the received signal. This processing typically comprises demodulation, decoding, and error correction operations, as will be discussed on greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal through the antenna switching circuitry 110 to the antennas 112. The multiple antennas 112 and the replicated transmit and receive circuitries 106, 108 may provide spatial diversity. Modulation and processing details will be understood by those skilled in the art.

The concepts provided herein illustrate the potential to significantly reducing resonator sizes and the currently typical practice of adding IDT capacitors to save space and/or avoid problematic spurious acoustic modes.

Those skilled in the art will recognize improvements and modifications to the preferred embodiments of the present disclosure. All such improvements and modifications are considered within the scope of the concepts disclosed herein and the claims that follow.

What is claimed is:

1. A Surface Acoustic Wave (SAW) device, comprising:
- a piezoelectric layer having a top surface;
- an interdigitated transducer having a first pattern and over the top surface of the piezoelectric layer; and
- an interface structure having a second pattern that corresponds to the first pattern and residing directly between the top surface of the piezoelectric layer and the interdigitated transducer, wherein:
  - the interface structure is formed of one or more of zirconium (Zr), magnesium (Mg), aluminum (Al), or a compound containing the same, and completely separates the interdigitated transducer from the piezoelectric layer; and
  - a plurality of elements of the interface structure are wider than corresponding elements of the interdigitated transducer, so as to reduce effective coupling of the SAW device without adding any extra capacitor to the SAW device.

2. The SAW device of claim 1 wherein the interface structure is directly on the top surface of the piezoelectric layer and the interdigitated transducer is directly on the interface structure.

3. The SAW device of claim 1 wherein each of the plurality of elements of the interface structure is wider than each of the corresponding elements of the interdigitated transducer.

4. The SAW device of claim 1 wherein the plurality of elements of the interface structure are at least 25% wider than the corresponding elements of the interdigitated transducer.

5. The SAW device of claim 1 wherein the plurality of elements of the interface structure are at least 50% wider than the corresponding elements of the interdigitated transducer.

6. The SAW device of claim 1 wherein the plurality of elements of the interface structure are at least 75% wider than the corresponding elements of the interdigitated transducer.

7. The SAW device of claim 1 further comprising a carrier substrate and wherein the piezoelectric layer is a piezoelectric film over the carrier substrate.

8. The SAW device of claim 7 further comprising at least one dielectric layer between the piezoelectric film and the carrier substrate.

9. The SAW device of claim 1 wherein the piezoelectric layer is a piezoelectric substrate.

10. The SAW device of claim 9 further comprising at least one dielectric layer over the top surface of the piezoelectric layer, the interdigitated transducer, and at least certain portions of the interface structure.

11. The SAW device of claim 1 wherein the interdigitated transducer has a thickness greater than a thickness of the interface structure.

12. The SAW device of claim 1 wherein the SAW device forms a SAW resonator.

13. A method of fabricating a Surface Acoustic Wave (SAW) device, comprising:

providing a piezoelectric layer having a top surface;

providing an interdigitated transducer having a first pattern and over the top surface of the piezoelectric layer; and providing an interface structure having a second pattern that corresponds to the first pattern and residing directly between the top surface of the piezoelectric layer and the interdigitated transducer, wherein:

the interface structure is formed of one or more of zirconium (Zr), magnesium (Mg), aluminum (Al), or a compound containing the same, and completely separates the interdigitated transducer from the piezoelectric layer; and a plurality of elements of the interface structure are wider than corresponding elements of the interdigitated transducer so as to reduce effective coupling of the SAW device without adding any extra capacitor to the SAW device.

14. A communication device comprising a Surface Acoustic Wave (SAW) device that comprises:

a piezoelectric layer having a top surface;

an interdigitated transducer having a first pattern and over the top surface of the piezoelectric layer; and an interface structure having a second pattern that corresponds to the first pattern and residing directly between the top surface of the piezoelectric layer and the interdigitated transducer, wherein:

the interface structure is formed of one or more of zirconium (Zr), magnesium (Mg), aluminum (Al), or a compound containing the same, and completely separates the interdigitated transducer from the piezoelectric layer; and a plurality of elements of the interface structure are wider than corresponding elements of the interdigitated transducer so as to reduce effective coupling of the SAW device without adding any extra capacitor to the SAW device.

* * * * *